(12) United States Patent
Lui

(10) Patent No.: US 6,391,761 B1
(45) Date of Patent: May 21, 2002

(54) METHOD TO FORM DUAL DAMASCENE STRUCTURES USING A LINEAR PASSIVATION

(75) Inventor: Lawrence Lui, Panchiao (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/398,293

(22) Filed: Sep. 20, 1999

(51) Int. Cl.[7] .......................................... H01L 21/4763
(52) U.S. Cl. ..................... 438/618; 438/624; 438/637; 438/638; 438/639
(58) Field of Search .............................. 438/637, 638, 438/639, 618, 624

(56) References Cited

U.S. PATENT DOCUMENTS

| 5,635,423 A | 6/1997 | Huang et al. | 437/195 |
| 5,677,243 A * | 10/1997 | Oshaki | 438/638 |
| 5,753,967 A | 5/1998 | Lin | 257/635 |
| 5,767,582 A | 6/1998 | Lee et al. | 257/753 |
| 5,840,625 A | 11/1998 | Feldner | 438/626 |
| 6,054,384 A * | 4/2000 | Wang et al. | 438/637 |
| 6,057,227 A * | 5/2000 | Harvey | 438/626 |

* cited by examiner

Primary Examiner—Wael Fabuuy Jr.
Assistant Examiner—Julio J. Maldonado
(74) Attorney, Agent, or Firm—George O. Saile; Stephen B. Ackerman; Rosemary L. S. Pike

(57) ABSTRACT

A method to form dual damascene structures is described. A substrate layer is provided. An anti-diffusion layer is deposited. A first dielectric layer is deposited. An etch stopping layer is deposited. A second dielectric layer is deposited. The second dielectric layer, the etch stopping layer, and the first dielectric layer are patterned to form the vias. A liner layer is deposited overlying the second dielectric layer and internal surfaces of the lower trenches. The liner layer and the second dielectric layer are patterned to form the upper trenches. The liner layer and the anti-diffusion layer are etched through to complete the formation of the dual damascene structure, and the integrated circuit device is completed.

20 Claims, 5 Drawing Sheets

METHOD TO FORM DUAL DAMASCENE STRUCTURES USING A LINEAR PASSIVATION

BACKGROUND OF THE INVENTION (1) Field of the Invention

The present invention relates to the fabrication of semiconductor structures, and more particularly, to a method to fabricate dual damascene structures in the manufacture of integrated circuits.

(2) Description of the Prior Art

The implementation of dual damascene structures is a recent development in the field of integrated circuit manufacture. The dual damascene process allows for the formation of conductive wiring with very fine line widths and spaces.

In a damascene process, wiring trenches are formed in an isolation layer. Next, a conductive material is deposited overlying the isolation layer and filling the trenches. Finally, a chemical mechanical polish (CMP) is performed to polish down the conductive material to the surface of the isolation layer. In this way, the conductive traces of metal are formed.

The dual damascene process extends this idea by forming both the metal traces and via plugs in one metal deposition. This is accomplished by forming both the via trenches and the trace trenches in the isolation layer before the metal deposition.

Referring to FIG. 1, a cross-section of a partially completed dual damascene structure is shown. A substrate layer 10 is depicted. The substrate layer 10 encompasses all underlying layers, devices, junctions, and other features that have been formed prior to the deposition and definition of the conductive traces 18 and the isolation layer 14. An anti-diffusion layer 22 composed of silicon oxynitride overlies the conductive traces 18 and the isolation layer 14. A via-level dielectric layer 26 composed of oxide overlies the anti-diffusion layer 22. An etch stopping layer 30 of silicon oxynitride overlies the via-level dielectric layer 26. An interconnect dielectric layer 34 of oxide overlies the etch stopping layer 30.

A layer of photoresist 38 is applied overlying the interconnect dielectric layer 34. The photoresist layer 38 is developed to create openings where vias will be formed. The vias will connect upper-level metal traces to the underlying conductive traces. After an etch process is performed using the photoresist as a mask, the via trenches are etched through the interconnect dielectric layer 34, the etch stopping layer 30, and the via-level dielectric layer 26.

After the via trenches are etched, as shown in FIG. 2, the first layer of photoresist 38 is stripped away. Now, as is typical in the prior art, a second layer of photoresist 42 is applied and developed. The openings in the second photoresist 42 expose the areas where the upper level trench will be formed. In this particular dual damascene structure, a dense array of closely spaced vias has been formed. Only one upper level trench will be formed overlying these vias.

Using the second photoresist as a mask 42, the metal level trench is now etched. The etch chemistry is specially selected such that the etch rate for the oxide of the interconnect dielectric layer 34 is greater than that for the silicon oxynitride etch stopping layer 30. Once the interconnect dielectric layer 34 is etched through to expose the underlying etch stopping layer 30, the etch is stopped. By design, the etch stopping layer 30 protects the via-level dielectric layer 26 from the etch, and thereby maintains the integrity of the via profiles.

However, as shown in FIG. 3, problems can arise in the prior art dual damascene technique. Because of the close spacing of the vias in the dense array, the oxide etch rate in the dense array area is increased. This causes an etch rate microloading between different via trenches. The effect is seen in faceting 46 of the via isolation profiles. If this problem occurs in the fabrication of the dual damascene structure, there is a high likelihood of metal to metal shorting across vias in the dense array area. Moreover, the dense via merge issue tends to induce a process difficulty in the following CMP process.

In an attempt to reduce the likelihood of this problem, the etch stopping layer 30 can be made thicker. If the etch stopping layer 30 is made thick enough, the faceting problem can be eliminated. However, this creates a new problem. Because the silicon oxynitride material of the etch stopping layer 30 has a relatively highdielectric constant, a thickening of the layer causes an increase in the line-to-line capacitance between the metal in the vias. This increase in capacitance loading represents a problem in higher speed applications.

Several prior art approaches attempt to form dual damascene structures. U.S. Pat. No. 5,840,625 to Feldner teaches a process to fabricate metal interconnects using tungsten and aluminum where tungsten or tungsten nitride is used to line either damascene or dual damascene trenches. U.S. Pat. No. 5,753,967 to Lin discloses a process to form damascene and dual damascene trenches where a vertical liner is formed to reduce the trench width. U.S. Pat. No. 5,767,582 to Lee et al shows a dual damascene process. U.S. Pat. No. 5,635,423 to Huang et al discloses a dual damascene process with an embodiment using a liner in the top trench.

SUMMARY OF THE INVENTION

A principal object of the present invention is to provide an effective and very manufacturable method of fabricating integrated circuits with dual damascene structures.

A further object of the present invention is to provide a method of fabricating dual damascene trenches using a liner layer to protect the via trenches during the etch of the metal level trenches.

A yet further object of the present invention is to provide a method of fabricating dual damascene metal interconnect and vias using a liner layer to protect the via trenches during the etch of the metal level trenches.

Yet another object of the present invention is to provide a method of fabricating dual damascene trenches in which the via top corner profile is improved.

Yet another object is to provide a method of fabricating dual damascene trenches in which rounding of the via top corners is prevented.

Yet another object is to provide a method of fabricating dual damascene trenches in which rounding of the via top corners is prevented by a liner layer within the via trenches.

A further object is to provide a method of fabricating dual damascene trenches using a liner layer to prevent rounding of the via top corners wherein the etch stop layer thickness can be decreased.

In accordance with the objects of this invention, a new method of fabricating an integrated circuit with dual damascene structures is achieved. A substrate layer is provided encompassing all underlying layers, devices, and junctions. Conductive plugs are provided in an isolating dielectric layer. An anti-diffusion layer is deposited overlying the conductive plugs and the isolating dielectric layer. A via-level dielectric layer is deposited overlying the anti-diffusion layer. An etch stopping layer is deposited overlying the via-level dielectric layer. An interconnect dielectric layer is deposited overlying the etch stopping layer. A first photoresist layer is applied overlying the interconnect dielectric layer. The first photoresist layer is developed to expose the underlying interconnect dielectric layer where via trenches overlying the conductive plugs are planned. The interconnect dielectric layer, etch stopping layer and via-level dielectric layer are etched through using the first photoresist layer as an etching mask to form the via trenches. The remaining first photoresist layer is stripped away. A liner layer is deposited overlying the interconnect dielectric layer and the internal surfaces of the via trenches. A barrier and anti-reflective coating layer is deposited overlying the liner layer. A second photoresist layer is applied overlying the barrier and anti-reflective coating layer. The second photoresist layer is developed to expose the underlying interconnect dielectric layer where metal interconnect trenches overlying at least a portion of the via trenches are planned. The exposed portion of the barrier and anti-reflective coating layer is removed. The liner layer and the interconnect dielectric layer are etched through using the second photoresist layer as an etching mask and stopping at the etch stopping layer to form the metal interconnect trenches. The remaining second photoresist is stripped away. The exposed liner layer, exposed etch stopping layer, and the exposed anti-diffusion layer are etched through to the underlying conductive plugs. A metal layer is deposited overlying the interconnect dielectric layer and filling the via trenches and the metal interconnect trenches. The metal layer is polished to form connective traces. A passivation layer is deposited overlying the metal interconnect layer to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
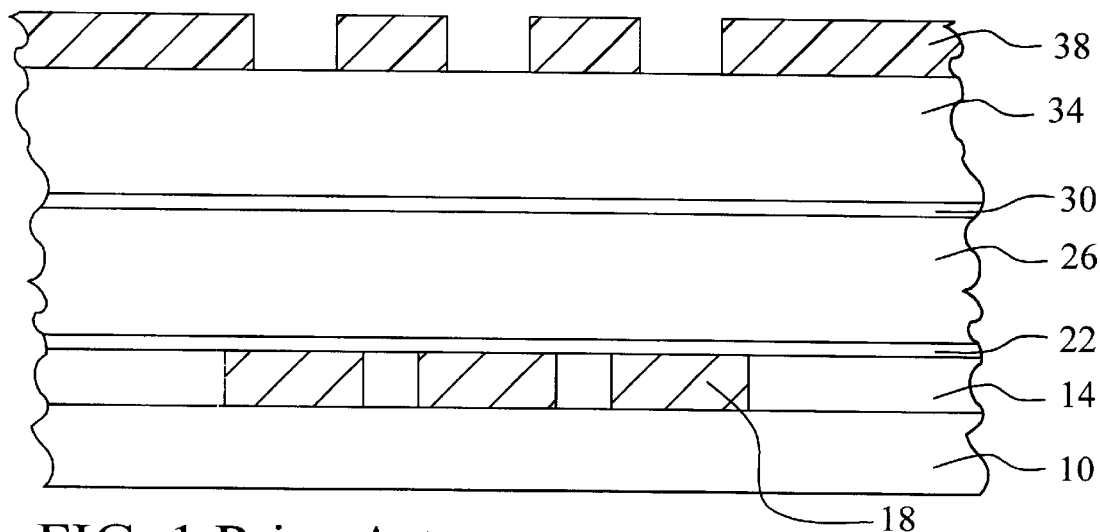
FIGS. 1 through 3 schematically illustrate in cross-section a partially completed prior art integrated circuit showing a dual damascene structure.
Figure 2:
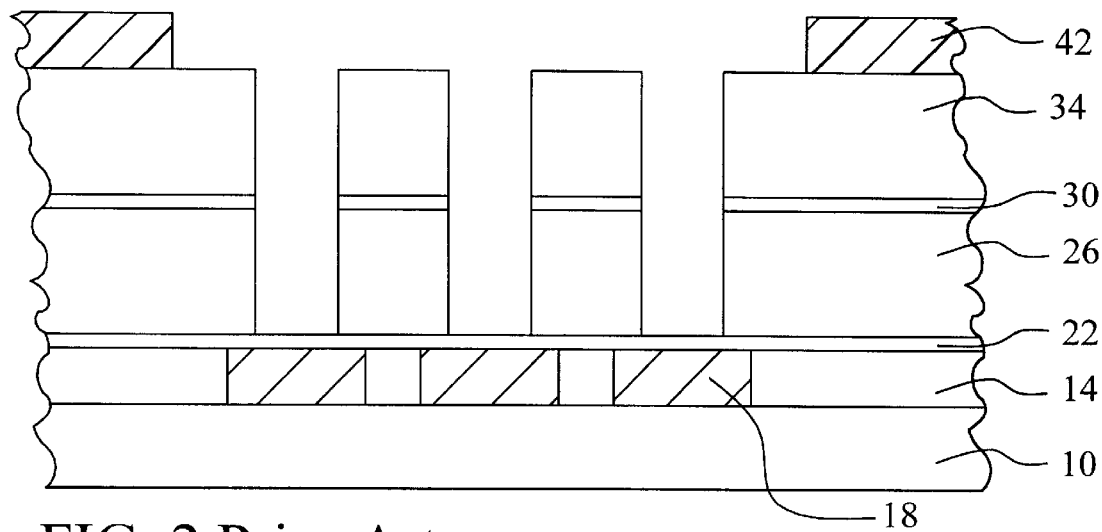
Figure 3:
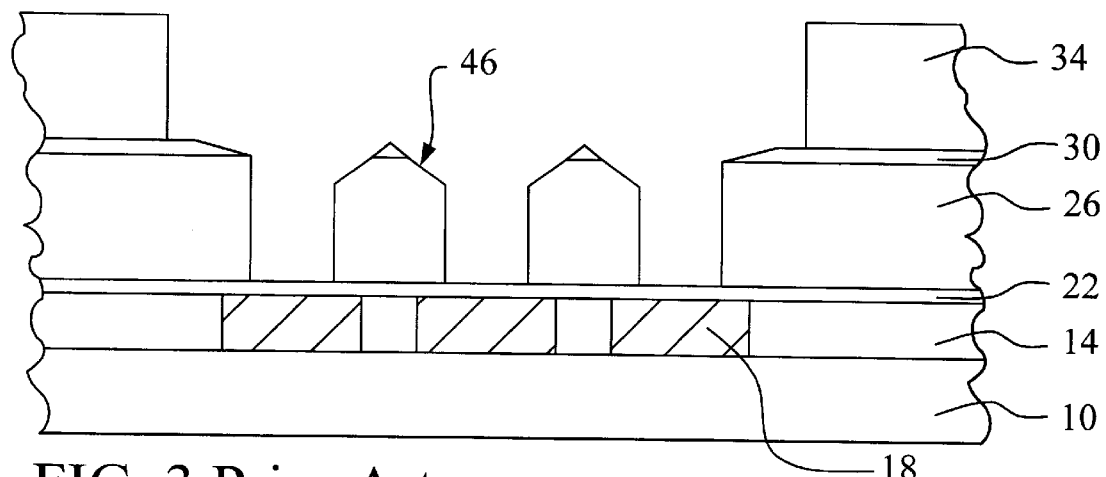
Figure 4:
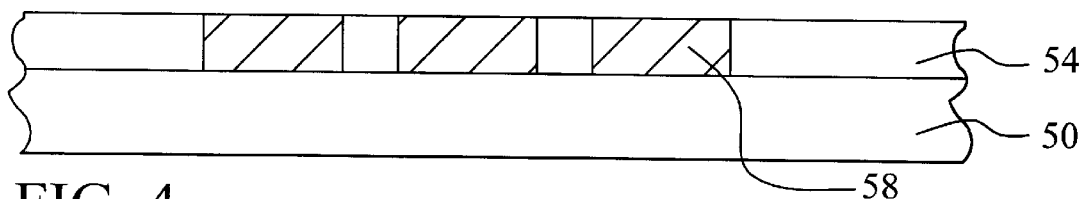
FIGS. 4 through 11 schematically illustrate in cross-sectional representation the present invention used to create dual damascene vias.

Referring now more particularly to FIG. 4, there is illustrated a portion of a partially completed integrated circuit. In this preferred embodiment, the present invention will be used to create dual damascene vias. It will be understood by those skilled in the art that the invention could be applied to the formation of other structures, including dual damascene structures that don't serve as via openings between metal layers. Substrate 50 encompasses all underlying layers, devices, junctions, and other features that have been formed prior to the deposition of an isolation layer 54. Metal lines 58 are provided in the isolation layer 54 as conventional in the art.

Figure 5:
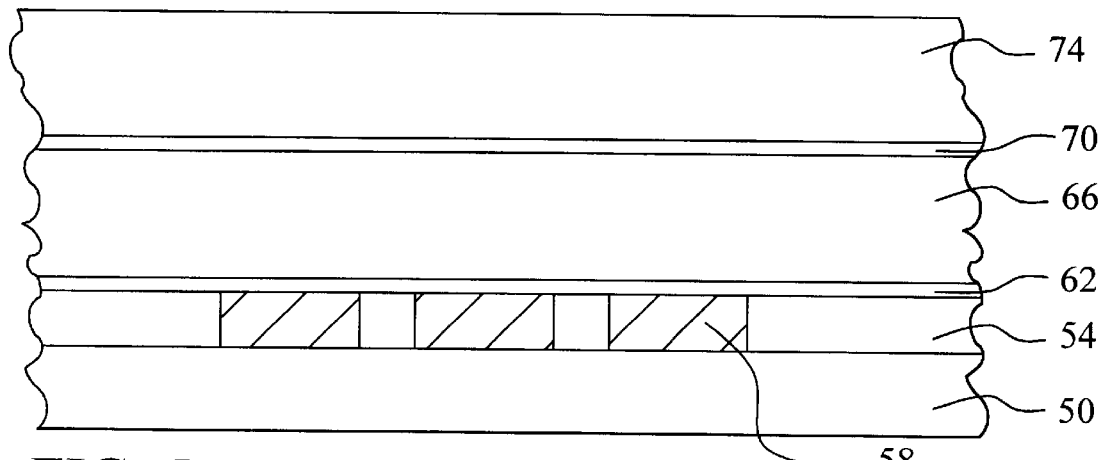

Referring now to FIG. 5, an anti-diffusion layer 62 is deposited overlying the metal stack 58 and the isolation layer 54. The anti-diffusion layer 62 is typically composed of conventionally deposited silicon oxynitride, silicon nitride, or silicon carbide. Preferably, the anti-diffusion layer is deposited to a thickness of between about 500 Angstroms and 1,500 Angstroms. The anti-diffusion layer acts as an etching stop for the subsequent via and trench etch.

A via-level dielectric layer 66 is deposited overlying the anti-diffusion layer 62. The via-level dielectric layer is preferably composed of an oxide such as a low dielectric constant fluorinated silicate glass (FSG) or another organic or inorganic low-k material. Preferably, the via-level dielectric layer 66 is deposited to a thickness of between about 3,000 Angstroms and 10,000 Angstroms.

An etch stopping layer 70 is now deposited overlying the via-level dielectric layer 66. The etch stopping layer stops the subsequent etch used to form the metal interconnect trenches. The etch stopping layer 70 is typically composed of conventionally deposited silicon oxynitride, silicon nitride, or silicon carbide. It is desirable to keep the etch stopping layer as thin as possible to reduce the capacitive coupling due to the relatively high dielectric constant of the etch stop layer. In the preferred embodiment, the etch stopping layer 70 is deposited to a thickness of between about 300 Angstroms and 1,500 Angstroms.

An interconnect dielectric layer 74 is deposited overlying the etch stopping layer 70. The interconnect dielectric layer is preferably composed of an oxide such as a low dielectric constant fluorinated silicate glass (FSG) or other organic or inorganic low dielectric constant material. Preferably, the interconnect dielectric layer 74 is deposited to a thickness of between about 5,000 Angstroms and 15,000 Angstroms.

Figure 6:
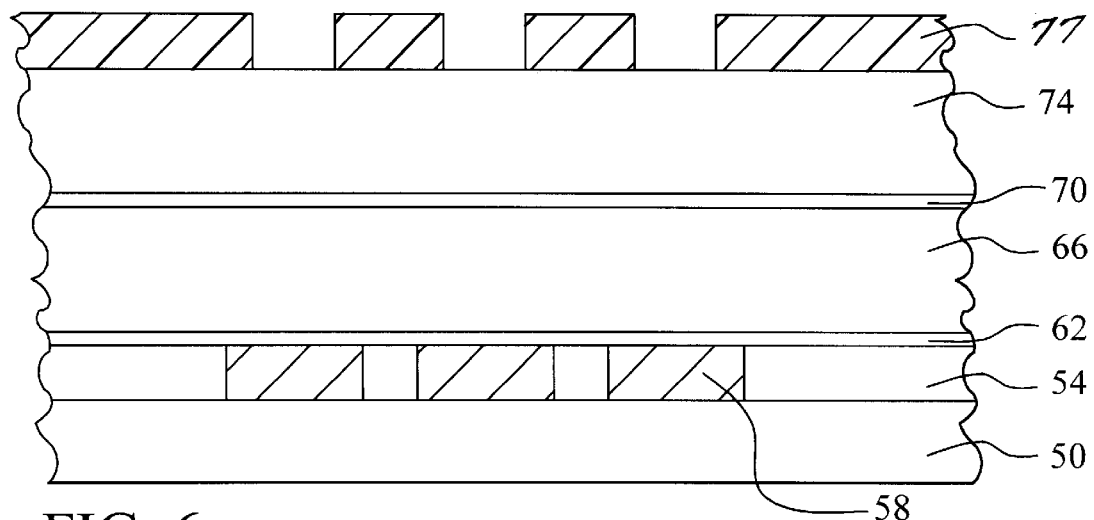

As shown in FIG. 6, a first photoresist layer 77 is applied overlying the interconnect dielectric layer 74. The first photoresist layer 77 is exposed in a photolithographic process and developed to create openings. These openings expose the underlying interconnect dielectric layer 74 where vias are planned. The interconnect dielectric layer 74, etch stopping layer 70, and via-level dielectric layer 66 are then etched through using the first photoresist layer as an etching mask to form the vias. The etching process is preferably a reactive ion etch (RIE) using series of steps with a conventional etch chemistry. The via etch is stopped when the anti-diffusion layer 62 is exposed at the bottom of the via trenches.

Figure 7:
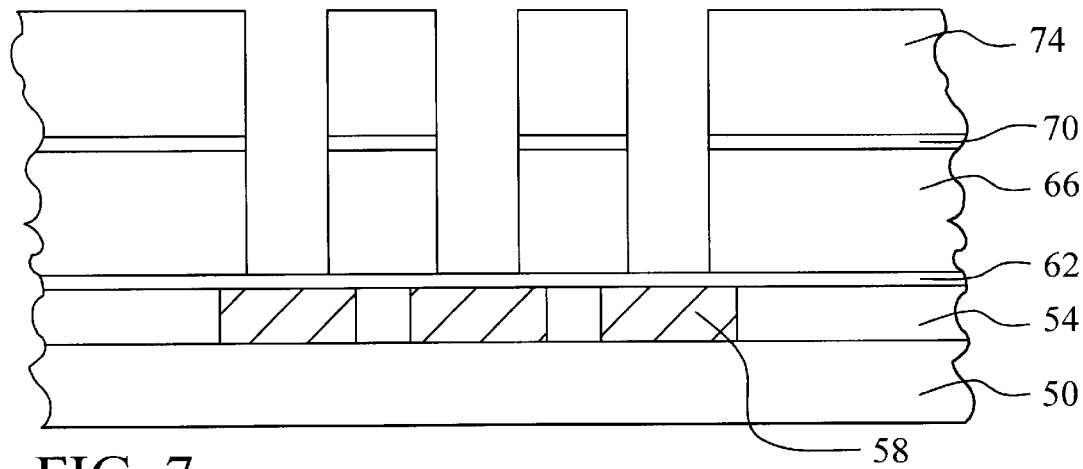

Following the etching step, the first photoresist layer is stripped away. The profile of the structures at this step in the process is shown in FIG. 7.

Figure 8:
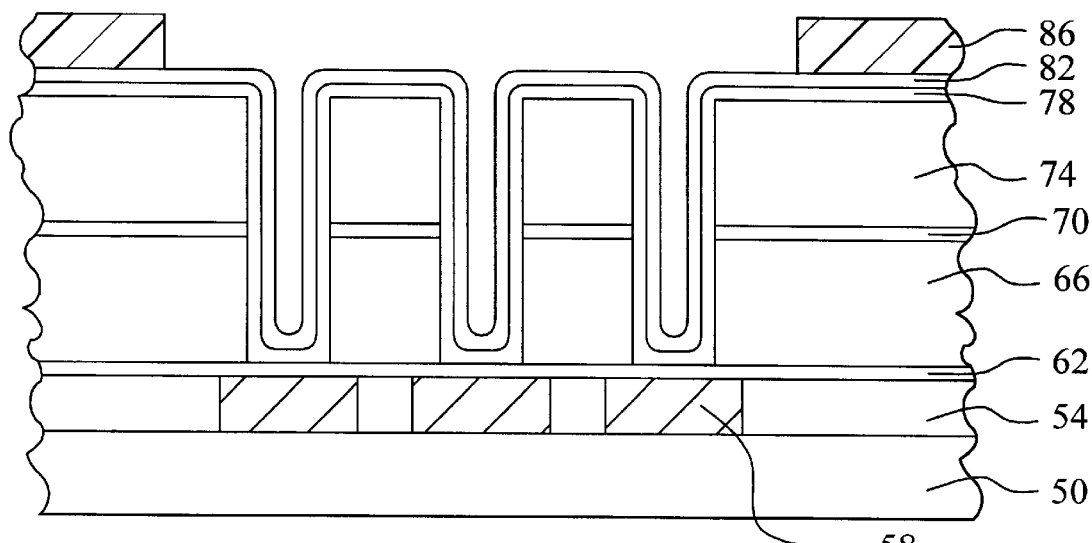

Referring now to FIG. 8, an important feature of the present invention will be described. As outlined in the prior art discussion, the problem area in the process concerns what happens to the via profiles during the metal connectivity layer etch. The novel solution of the present invention is to deposit a liner layer 78 overlying the interconnect dielectric layer 74 and the internal surfaces of the vias. The liner layer 78 is preferably composed of silicon nitride, though silicon oxynitride or silicon carbide may also be used. The purpose of the liner layer is to protect the vertical sidewalls of the via trenches during the metal connectivity layer etch. The liner layer acts as an etching stop for the oxide etch due to the relatively low etch rate of silicon nitride when compared to oxide. Even a very thin layer of silicon nitride has been shown to effectively protect the vertical sidewalls of the via trenches. Experimental data shows that even a 200 Angstroms liner layer of silicon nitride can make a distinctive improvement in the via trench profiles by inhibiting via corner faceting and preventing the loss of the anti-diffusion layer at the bottom of each trench.

In the preferred embodiment, the lining layer 78 is composed of silicon nitride or silicon oxynitride conventionally deposited to a thickness of between about 50 Angstroms and 500 Angstroms.

An organic barrier and anti-reflective coating (BARC) layer 82 is deposited overlying the liner layer 78. The purpose of the BARC layer 82 is to reduce the sensitivity of the photolithographic step to interference and to improve resolution. A second photoresist layer 86 is applied overlying the barrier and anti-reflective coating layer 82. The second photoresist layer 86 is exposed in a photolithographic process and developed to create openings. The second photoresist layer 86 is developed where metal interconnect trenches overlying at least a portion of the via trenches are planned. The exposed part of the barrier and anti-reflective coating layer 82 is then removed.

The liner layer 78 and the interconnect dielectric layer 74 are then etched through using the second photoresist layer 86 as an etching mask to form the metal interconnect trenches. The etching process is preferably a reactive ion etch (RIE) using a conventional etching chemistry. The etching stops at the etch stopping layer 70 to form the metal interconnect trenches.

Figure 9:
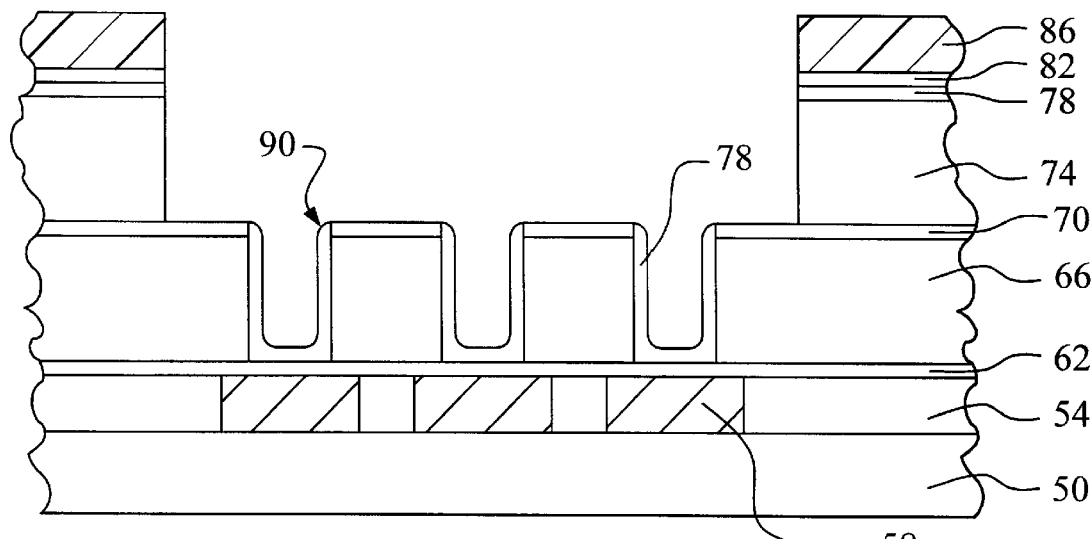

Referring now to FIG. 9, the etch produces the profile shown. The liner layer 78 protected the vertical sidewalls of the vias during the etch. In this way, the faceting seen in the prior art process is eliminated as shown by 90. As a result, the vias will remain completely isolated from each other in the subsequent processing. After the trench etch, the remaining second photoresist layer 86 is stripped away.

Figure 10:
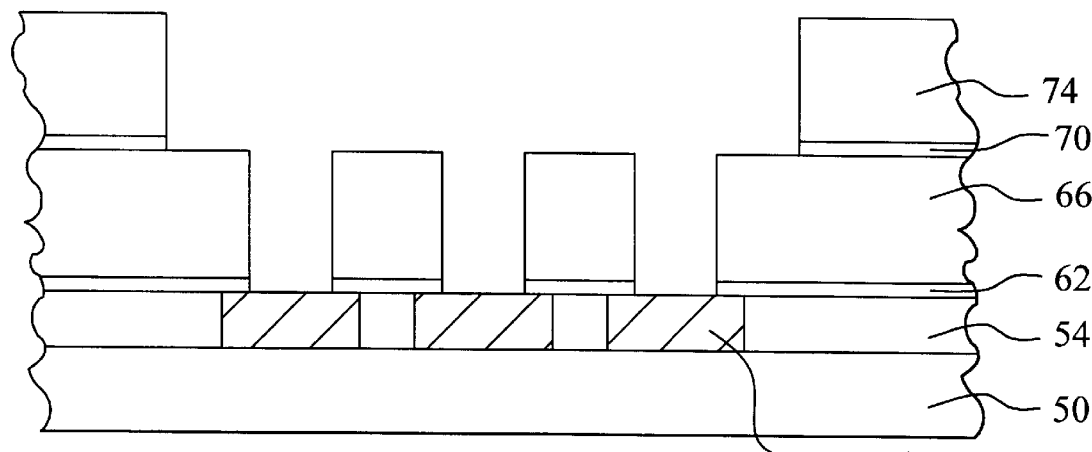

Referring now to FIG. 10, a finishing etch is performed to remove the remaining liner layer 78, exposed etch stopping layer 70, and the etch through the anti-diffusion layer 62. This etch completes the vias down to the metal stack 58. The finishing etch is preferably a reactive ion etch (RIE) using an etch chemistry comprising $CH_2F_2$, $CH_3F$, $CHF_3$, $O_2$, $N_2$, and Ar.

Figure 11:
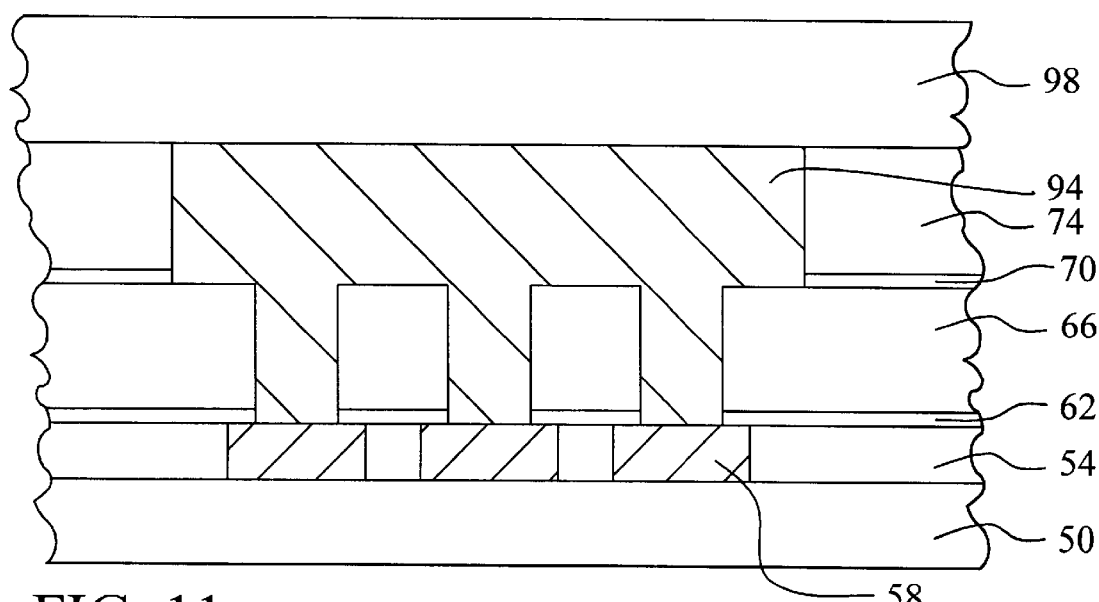

Referring now to FIG. 11, a metal layer 94 is deposited overlying the interconnect dielectric layer 74 and filling the metal interconnect and via trenches. The metal layer 94 may then be polished by chemical mechanical polishing (CMP) to form conductive traces as shown. Finally, if this is the top metal layer, a layer of plasma nitride passivation 98 is deposited overlying the metal layer 94 to complete the integrated circuit device. If this is not the top metal layer, further levels of metalization may be formed according to the process of the invention.

The process of the present invention provides a very manufacturable method for fabricating a dual damascene structure in the fabrication of an integrated circuit device. The process of the invention has been tested and SEM results show a distinct improvement on both the via corner profile and the bottom stop layer loss.

While the invention has been particularly shown and described with reference to the preferred embodiments thereof, it will be understood by those skilled in the art that various changes in form and details may be made without departing from the spirit and scope of the invention.

What is claimed is:

1. A method to form dual damascene trenches in the fabrication of an integrated circuit device comprising:
    depositing an anti-diffusion layer overlying a semiconductor substrate;
    depositing a first dielectric layer overlying said anti-diffusion layer;
    depositing an etch stopping layer overlying said first dielectric layer;
    depositing a second dielectric layer overlying said etch stopping layer;
    patterning said second dielectric layer, said etch stopping layer, and said first dielectric layer and to form vias stopping at said anti-diffusion layer;
    depositing a liner layer overlying said second dielectric layer and internal surfaces of said vias;
    thereafter forming a trench mask overlying said liner layer wherein said liner layer is exposed where a trench is planned;
    thereafter patterning said liner layer and said second dielectric layer where exposed by said trench mask and stopping at said etch stopping layer to form a trench overlying said vias wherein said liner layer remains overlying said internal surfaces of said vias after said patterning;
    thereafter removing said trench mask; and
    thereafter removing said liner layer, said etch stopping layer, and said anti-diffusion layer within said trench and vias to complete the formation of said dual damascene trenches of said integrated circuit device.

2. The method according to claim 1 wherein said anti-diffusion layer comprises one of the group containing: silicon oxynitride, silicon nitride, and silicon carbide.

3. The method according to claim 1 wherein said first dielectric layer comprises one of the group of fluorinated silicate glass, silicon dioxide, organic low dielectric constant materials, and inorganic low dielectric constant materials.

4. The method according to claim 1 wherein said etch stopping layer comprises one of the group containing: silicon oxynitride, silicon nitride, and silicon carbide.

5. The method according to claim 1 wherein said etch stopping layer is deposited to a thickness of between about 300 Angstroms and 1,500 Angstroms.

6. The method according to claim 1 wherein said second dielectric layer is deposited to a thickness of between about 5,000 Angstroms and 15,000 Angstroms.

7. The method according to claim 1 wherein said liner layer comprises one of the group containing: silicon oxynitride, silicon nitride, and silicon carbide.

8. The method according to claim 1 wherein said liner layer is deposited to a thickness of between about 50 Angstroms and 500 Angstroms.

9. A method to form dual damascene metal interconnects in the fabrication of an integrated circuit device comprising:
    providing metal lines in an isolation layer overlying a semiconductor substrate;
    depositing an anti-diffusion layer overlying said metal lines;
    depositing a first dielectric layer overlying said anti-diffusion layer;
    depositing an etch stopping layer overlying said first dielectric layer;
    depositing a second dielectric layer overlying said etch stopping layer;
    patterning said second dielectric layer, said etch stopping layer, and said first dielectric layer, stopping at said anti-diffusion layer, to thereby form vias;
    depositing a liner layer overlying said second dielectric layer and internal surfaces of said via trenches;
    thereafter forming a trench mask overlying said liner layer wherein said liner layer is exposed where a trench is planned;
    thereafter patterning said liner layer and said second dielectric layer where exposed by said trench mask to thereby form a trench overlying said vias wherein said liner layer remains overlying said internal surfaces of said via trenches after said patterning;
    thereafter removing said trench mask; and
    thereafter removing said liner layer, said etch stopping layer, and said anti-diffusion layer within said trench and vias to expose said metal line;

depositing a metal layer overlying said first dielectric layer and filling said trench and said vias; and polishing to complete formation of metal interconnects in the fabrication of said integrated circuit device.

10. The method according to claim 9 wherein said anti-diffusion layer comprises one of the group containing: silicon oxynitride, silicon nitride, and silicon carbide.

11. The method according to claim 9 wherein said etch stopping layer comprises one of the group containing: silicon oxynitride, silicon nitride, and silicon carbide.

12. The method according to claim 9 wherein said etch stopping layer is deposited to a thickness of between about 300 Angstroms and 1,500 Angstroms.

13. The method according to claim 9 wherein said liner layer comprises one of the group containing: silicon oxynitride, silicon nitride, and silicon carbide.

14. The method according to claim 9 wherein said liner layer is deposited to a thickness of between about 100 Angstrom and 500 Angstroms.

15. The method according to claim 9 wherein said step of polishing comprises a chemical mechanical polish.

16. A method to form dual damascene metal interconnects in the fabrication of an integrated circuit device comprising:

providing metal lines in an isolation layer overlying a semiconductor substrate;

depositing an anti-diffusion layer overlying said metal lines;

depositing a first dielectric layer overlying said anti-diffusion layer;

depositing an etch stopping layer overlying said first dielectric layer;

depositing a second dielectric layer overlying said etch stopping layer;

patterning said second dielectric layer, said etch stopping layer, and said first dielectric layer, stopping at said anti-diffusion layer, to thereby form vias;

depositing a liner layer overlying said second dielectric layer and internal surfaces of said via trenches wherein said liner layer comprises one of the group containing: silicon nitride, silicon oxynitride, and silicon carbide;

patterning said liner layer and said second dielectric layer to thereby form a trench overlying said vias wherein said liner layer remains overlying said internal surfaces of said via trenches after said step of patterning;

thereafter removing said liner layer, said etch stopping layer, and said anti-diffusion layer within said trench and vias to expose said metal line;

depositing a metal layer overlying said first dielectric layer and filling said trench and said vias; and polishing to complete formation of metal interconnects in the fabrication of said integrated circuit device.

17. The method according to claim 16 wherein said etch stopping layer comprises one of the group containing: silicon oxynitride, silicon nitride, and silicon carbide.

18. The method according to claim 16 wherein said etch stopping layer is deposited to a thickness of between about 300 Angstroms and 1,500 Angstroms.

19. The method according to claim 16 wherein said liner layer is deposited to a thickness of between about 100 Angstroms and 500 Angstroms.

20. The method according to claim 16 wherein said step of polishing comprises a chemical mechanical polish.

* * * * *

UNITED STATES PATENT AND TRADEMARK OFFICE
CERTIFICATE OF CORRECTION

PATENT NO. : 6,391,761 B1
DATED : May 21, 2002
INVENTOR(S) : Lawrence Lui

It is certified that error appears in the above-identified patent and that said Letters Patent is hereby corrected as shown below:

Title page,
Item [54], the Title should read -- METHOD TO FORM DUAL DAMASCENE STRUCTURES USING A LINER PASSIVATION --.

Signed and Sealed this

Twenty-sixth Day of November, 2002

Attest:

Attesting Officer

JAMES E. ROGAN
Director of the United States Patent and Trademark Office